(12) United States Patent
Wang et al.

(10) Patent No.: US 6,416,625 B1
(45) Date of Patent: Jul. 9, 2002

(54) MANUFACTURING METHOD OF FLUORO BASED COMPOSITE BOARDS

(75) Inventors: Shian-Yih Wang, Taipei; Yung-Chih Chen, Hsinchu; Lung-Cheng Cheng, Hsinchu; Shi-Ing Huang, Hsinchu; Chun-Sheng Chen, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/988,041

(22) Filed: Nov. 16, 2001

(51) Int. Cl.[7] .................. B32B 19/02; B32B 31/00
(52) U.S. Cl. .............. 162/156; 162/173; 162/181.6; 162/225; 156/62.2
(58) Field of Search ................... 162/102, 145, 162/156, 173, 181.6, 225, 227; 156/62.2

(56) References Cited

U.S. PATENT DOCUMENTS 4,335,180 A    6/1982   Traut
4,485,182 A   * 11/1984   Enomoto et al. ........... 501/102
5,358,775 A    10/1994   Horn, III

* cited by examiner

*Primary Examiner*—Sam Chuan Yao
(74) *Attorney, Agent, or Firm*—Birch, Stewart, Kolasch & Birch, LLP

(57) ABSTRACT

In the manufacturing method of fluoro based polymer composite boards of the invention, which provides a fast process and high efficiency, a suitable amount of water soluble organic solvent is added to a fluoro based polymer suspension during the process of mixing ceramic powder and/or glass fiber to the fluoro based polymer suspension in order to improve the coagulation of the fluoro based polymer and ceramic powder, and to reduce the gelling time. During the process of mixing ceramic powder and/or glass fiber, the fluoro based polymer suspension and the organic solvent, a suitable amount of water can be added to control the ratio between the water and the organic solvent obtained from the mixture. The gelling time of the mixture can thus be reduced. By controlling the ratio between the water and the organic solvent obtained from the mixture, there is still enough time to allow homogeneous mixing after the gelling speed is increased.

14 Claims, 2 Drawing Sheets

MANUFACTURING METHOD OF FLUORO BASED COMPOSITE BOARDS

BACKGROUND OF THE INVENTION

1. Field of the Invention

The invention relates to a manufacturing method of fluoro based composite boards, and especially to a manufacturing method of fluoro based composite boards processed by a mixing-gelling step, which involves mixing fluoro based polymer suspension with ceramic powder and/or glass fiber.

2. Related Art

There are various materials used for producing circuit boards (for example, Print Circuit Board or IC package substrate). For resin based circuit board materials, thermo-setted plastic resin materials such as phenolic resin, epoxy resin, polyimide resin, PTFE (polytetrafluoroethylene) and Bismaleimide Triazine (BT) are widely used. Circuit boards produced by an epoxy resin matrix are the most common applications in the printed circuit board industry. This kind of epoxy resin is called FR-4 resin containing bromide. Because FR-4 resin can easily adhere to copper foil and composite formed by FR-4 resin and glass fiber reinforcing filler, and it has the advantages of high flexibility, low cost, a simple reaction process and good processing, FR-4 resin is widely used for circuit boards. The dielectric constant of FR-4 resin is very high (about 4.5), so it causes interference with telecommunication signals. This is why FR-4 resin is generally used with circuit boards containing electronic devices with a frequency lower than 2 GHz. High frequency circuit board materials used for satellite receivers, wireless communication devices, high frequency microwave communication, radar facilities and other instruments requiring high precision can be divided into three categories. BT resin is used for circuit boards with a frequency of 2–12 GHz. PTFE resin is used for circuit boards with a frequency higher than 10 GHz. However, there are drawbacks for fluoro based resin (for example, PTFE) when used as high frequency circuit board composite material: (1) the glass transit temperature is too low (about 19° C.), the material is too soft, with low scratch resistance and poor drilling performance, (2) the processing temperature is too high (about 370° C.), the processing pressure is too great (about 1600 psi), poor mixing and dispersion, and the reaction time is too long, (3) chemically inert, very hard to activate aperture wall in the plated through hole (PTH) process, (4) high cost (ten times that of FR-4).

In order to simplify the process and reduce processing time, a better method for manufacturing fluoro based composite material circuit boards, such as a manufacturing method of microwave circuit boards, is disclosed in U.S. Pat. No. 4,335,180. Ceramic powder acting as a reinforcing filler is mixed with tetra-fluoro ethylene suspension, and PEI (polyethyeneimine) is added to act as an addictive for reducing the gelling time of the tetra-fluoro ethylene suspension. The Mixture is stirred to mix homogeneously and gel gradually. The solution is then removed from the gelled mixture and DPG (dipropylene glycol) acting as a processing aid is added and a lamella shaped product is produced. A composite board is formed after the sintering process. In this process, PEI is used to increase the aggregation of tetra-fluoro ethylene in suspension and thus decrease the gelling time. However, this method still has the problem of long gelling time and extra processes are required to remove the PEI.

In addition, in the method disclosed in U.S. Pat. No. 5,358,775, a coupling agent is absorbed on the ceramic powder surface, the ceramic powder is homogeneously mixed with poly tetra-fluoro ethylene, aqueous HCl solution is added to increase gelling speed, DPG is added to be a processing aid, and the whole solution is stirred to in order to mix homogeneously and gel gradually. Subsequently, the lamella shaped board is formed by the gelled mixture, and then sintered to form a composite board. This method solved the problem of long gelling time but adding HCl creates the problem of residual chlorine and limits the application of the composite board.

Therefore, it is necessary to propose a novel manufacturing method of composite boards to solve the problem of long gelling time.

SUMMARY OF THE INVENTION

Accordingly, the object of the invention is to propose a manufacturing method of composite boards having the advantages of a simple process, short gelling time, and high efficiency.

To obtain this objective, a suitable amount of water soluble organic solvent is added to the fluoro based polymer suspension during the process of mixing ceramic powder and/or glass fiber to the fluoro based polymer suspension in order to improve the coagulation of fluoro based polymer and ceramic powder, and to reduce the gelling time. During the process of mixing ceramic powder and/or glass fiber, the fluoro based polymer suspension and the organic solvent, a suitable amount of water can be added to control the ratio between water and the organic solvent obtained from the mixture. The gelling time of the mixture can be reduced from three hours (without adding organic solvent) to less than ten minutes. By controlling the ratio between water and the organic solvent obtained from the mixture, there is still enough time to allow homogeneous mixing after the gelling speed is increased.

The manufacturing method of composite boards of the invention comprises following steps: prepare a mixture of ceramic powder and/or glass fiber to act as a reinforcing filler; a water soluble organic solvent is mixed with the fluoro based polymer suspension (for example, PTFE); vibrate or stir to create a homogenous mixture; the fluoro based polymer and the ceramic powder and/or glass fiber then coagulate; remove extra organic solvent and water; a specific shape of the mixture is formed by a rolling process; finally, the mixture is sintered to form the composite board.

The organic solvent can be IPA (isopropyl alcohol), water soluble alcohol and/or ketone. The ceramic powder or glass fiber can be silicon dioxide, a suitable ceramic material, or a mixture of ceramic materials. During the process of mixing the ceramic powder and/or the glass fiber, the fluoro based polymer suspension and the organic solvent, the organic solvent of the mixture and water are controlled to achieve a suitable ratio. For example, the organic solvent is about 5–10 wt. % (weight percentage) of the mixture, and the water is about 10–30 wt. % of the mixture. In this case, the gelling time of the mixture is reduced to less than ten minutes, which is much faster but not too fast. In the above mixing process, a suitable amount of water can be added as necessary. A better process is to thoroughly mix the water, the organic solvent, and the ceramic powder and/or the glass fiber, then add the fluoro based polymer suspension. A coupling agent layer is coated on the surface of the ceramic powder and/or glass fiber before the ceramic powder and/or glass fiber is mixed with water and the organic solvent. The coupling agent can be a (silane) coupling agent, zirconium based coupling agent, titanium based coupling agent, fluoro based coupling agent or a combination of these coupling agents. According to the invention, the process of coating the coupling agent to the surface of the ceramic powder and/or glass fiber can be integrated into the mixing process. Therefore, the traditional dry heat process for removing the coupling agent solution of the coupling agent coating process is unnecessary. Thus, the process is simplified and efficiency is increased.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
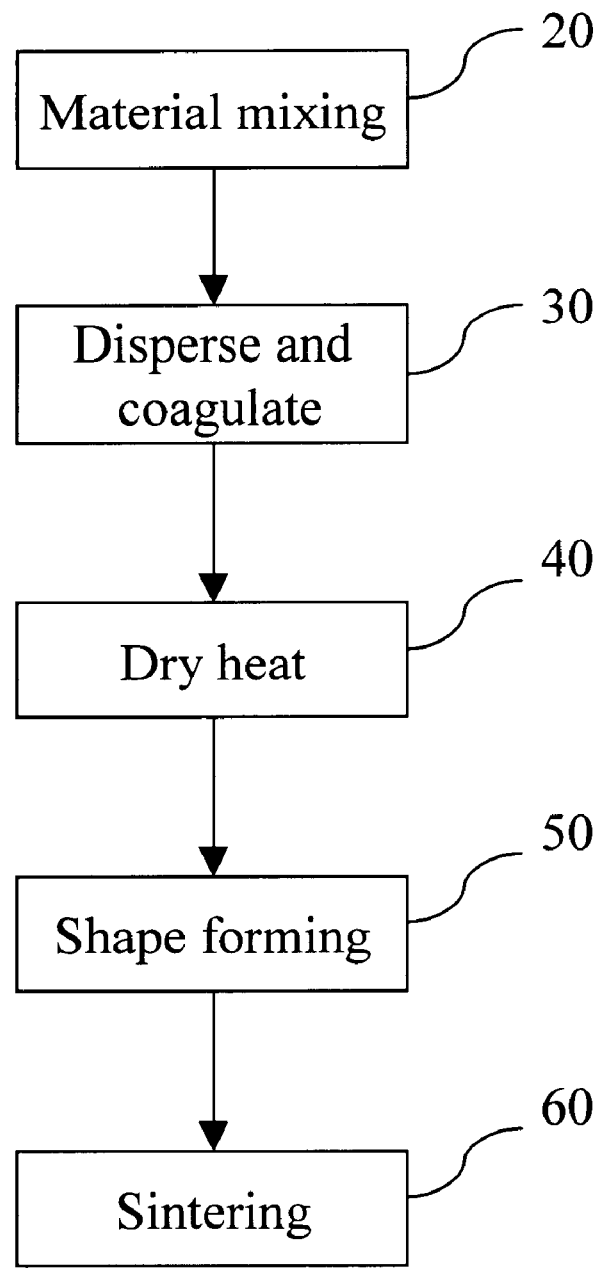
FIG. 1 illustrates a flow chart for the manufacturing method of fluoro based composite boards of the invention.

FIG. 1 illustrates a flow chart for the manufacturing method of fluoro based composite boards of the invention.

First, a material mixing step 20 is performed in which a pre-calculated ratio of silicon dioxide powder, isopropyl alcohol (IPA) and poly-tetra-fluoro-ethylene suspension are mixed together. The silicon dioxide powder can be used as a reinforcing filler for reinforcing the composite board and adjusting the thermal expansion coefficient and dielectric properties. Because silicon dioxide has a high dielectric constant (about 6), the silicon dioxide of the composite board is usually controlled to about 55 wt %~85 wt % of the composite board to obtain a high rigidity, low dielectric constant (lower than 3.5), and low dissipating factor (lower than 0.003) composite board. The poly-tetra-fluoro-ethylene suspension is a solution consisting of interfacial activation agent and poly-tetra-fluoro-ethylene powder dispersed in the solution. The poly-tetra-fluoro-ethylene is used as the matrix of the composite board. According to the invention, the IPA is a gelling accelerator for destroying the equilibrium of the interfacial activation agent in PTFE suspension and then causing accelerated coagulation of the PTFE and the silicon dioxide powder, to decrease the gelling time of the mixture. It is better to reduce the gelling time (for example, to less than ten minutes), but the time cannot be so short that it prevents the homogenous dispersion of every ingredient (for example, silicon dioxide powder) in the mixture. The IPA is usually controlled to about 5–10 wt. % of the mixture, and the water is about 10–30 wt. % of the mixture. In this case, a faster gelling time of the mixture can be obtained. In order to adjust the ratio of IPA and water, a suitable amount of water can be added during the mixing process mentioned above. A better process is to homogenously mix a suitable amount of water, the silicon dioxide powder and the IPA, and then add the PTFE suspension. According to the invention, a coupling agent can be coated on the surface of the silicon dioxide in order to increase the bonding between the silicon dioxide powder of the composite board and the PTFE matrix.

Although the silicon dioxide powder, IPA, and the PTFE matrix are illustrated for the above process of this embodiment, according to the invention the ceramic powder or the glass fiber can be one or more of various suitable ceramic materials or glass fibers. The IPA can be replaced with organic solvents such as ketone, alcohol, or a mixture of water-soluble ketone and alcohol. The PTFE can be replaced with other fluoro based polymers or mixed with other polymer materials. In addition to the silane coupling agent coated on the ceramic powder, it is also possible to used other silane coupling agents, zirconium based coupling agents, titanium based coupling agents, fluoro based coupling agents or a combination of these coupling agents.

After finishing the above mixing step, uniformly disperse the ingredients of the mixture until the PTFE and the silicon dioxide powder coagulate 30. Strong stirring or vibrating can be used to homogeneously disperse the PTFE and the silicon dioxide powder of the mixture until the mixture coagulates. Subsequently, a dry heat step 40 or other method can be performed to remove extra organic solvent and water in the mixture. For example, the mixture is heated at 130° C. for three hours and then formed to have a specific shape 50 before being sintered 60. The sintering can be done, for example, at a temperature of 360° C. for 40 minutes.

According to the invention, a flow aid can be added during the above mixing process. For example, the flow aid can be DPG or other suitable oil that makes it easier to undergo the subsequent shape forming process 50. It is also possible to add flow aid to the mixture after the dry heat step 40 is done.

Furthermore, according to the invention, the material mixing process 20 can be integrated with the process of coating a coupling agent to the surface of the ceramic powder and/or glass fiber. Therefore, the traditional dry heat process for removing the coupling agent solution of the coupling agent coating process is unnecessary. Thus, the process is simplified and efficiency is increased. This method involves mixing the organic solvent or solution containing the coupling agent with the ceramic powder before mixing so the coupling agent will be coated on the surface of the ceramic powder. The subsequent mixing of solvent and fluoro based polymer suspension is then performed without a dry heat process.

Figure 2:
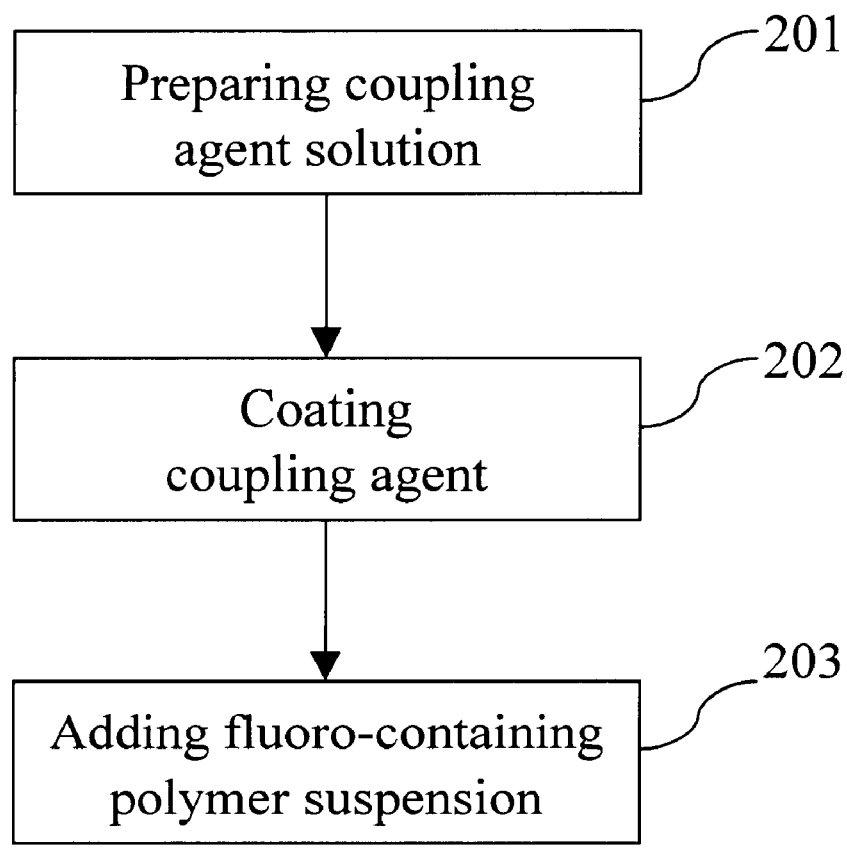
FIG. 2 illustrates a flow chart for the mixing method integrated with the coupling agent coating process.

FIG. 2 illustrates a flow chart for the mixing method integrated with the coupling agent coating process. A step 201 for preparing the coupling agent solution is performed. The coupling agent is homogeneously mixed with a suitable amount of IPA or water and then aged for 6 hours. The coupling can be, for example, the Z6024 or Z6020 silane coupling agent produced by Dow Corning. A suitable amount of acid can be added to the coupling agent solution to adjust its PH value.

A subsequent coating coupling agent step 202 is performed. Silicon dioxide is mixed with one (or more than one) coupling agent solution. More IPA or water can be added to the coupling agent solution. The coupling agent solution is stirred at a moderately high temperature (about 70° C.) for 30 minutes in order to coat the surface of the ceramic powder with the coupling agent. Step 203 of adding PTFE suspension is then performed. A suitable amount of water or IPA can be added to the solution as well. The suitable amount of water or IPA is added in order to obtain a suitable ratio between water and IPA in the final mixture. After finishing the above steps, the mixing process is done and the mixture can be stirred until the PTFE and the silicon dioxide powder coagulate.

TABLE 1

| Sample | Dk | Df | Imag | Freq (GHz) | Thickness (mm) | E* (MPa) |
|---|---|---|---|---|---|---|
| A with silane | 2.75223 | 0.00177 | 0.00487 | 5.223 | 0.79 | 1560 |
| B no silane | 2.60662 | 0.00187 | 0.00487 | 5.227 | 0.79 | 1070 |
| C (water based silane) | 2.48198 | 0.00250 | 0.00621 | 5.221 | 0.88 | 1908 |
| D2 standard | 2.92245 | 0.00193 | 0.00565 | 5.216 | 0.84 | 1722 |

Table 1 illustrates the properties obtained from A, B, C, and D2 test boards. The material mixing methods and the ingredients of the four test boards are shown as follows.

Test board A:
 (a) Dow Corning Z6124 (8 g)+IPA (190 g)+water (10 g)+acid (for controlling the PH value to 4.5–5.5), after the mixture has been stirred by a stirrer to reach a homogenous phase, the mixture is aged for 6 hours.
 (b) Dow Corning Z6020 (4 g)+IPA (9.5 g)+water (0.5 g), after the mixture has been stirred by a stirrer to reach a homogenous phase, the mixture is aged for 6 hours, and IPA (66 g) is added.
 (a) 104 g+(b) 20 g+IPA (100 g)+silicon dioxide (500 g) is stirred at 70° C. for 30 minutes and then water (400 g) is added.

The mixture of previous products 135 g (silicon dioxide 60 g), PTFE 60 wt % emulsion 66.67 g (PTFE 40 g) are mixed and then stirred until they coagulate.

Test board B:
Silicon dioxide 600 g, PTFE 60 wt % solution 666.67 g (PTFE 400 g), mix together and shake till they coagulate.

Test board C:
Dow Corning Z6020 (10 g)+water (25 g), after the mixture has been stirred by a stirrer to reach a homogenous phase, the mixture is aged for 6 hours, water 830 g and silicon dioxide 1000 g are added at 70° C. and then stirred for 30 minutes, IPA 410 g is added and then mixed homogenously.

Previous mixture and PTFE 60 wt % emulsion 1111.12 g (PTFE 666.67 g) are mixed and then stirred to coagulate.

Test board D2:
 (a) Dow Coming Z6124 (8 g)+IPA (190 g)+water (10 g)+acid for controlling the PH value to 4.5–5.5, after the mixture has been stirred by a stirrer to reach a homogenous phase, the mixture is aged for 6 hours.
 (b) Dow Coming Z6020 (4 g)+IPA (9.5 g)+water (0.5 g), after the mixture has been stirred by a stirrer to a reach homogenous phase, the mixture is aged for 6 hours, IPA (66 g) is then added.
 (a) 104 g+(b) 20 g+IPA (100 g)+silicon dioxide (500 g) are stirred at 70° C. for 30 minutes, solvent is filtered and then IPA is used to wash silicon dioxide, set oven to 130° C. for 3 hours, the product is crushed and then filtered to have suitable particle size.

Silicon dioxide 600 g and PTFE emulsion (60 wt %) are mixed and then stirred to coagulate.

From the values in Table 1, the manufacturing method of composite test boards (test boards A and C) of the invention have good dielectric properties and good rigidity, as required for high frequency circuit boards. Compare this to the composite test boards produced by the conventional method (test boards B and D2). The invention improves the quality of circuit boards and reduces processing time. Therefore, manufacturing efficiency is increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of fluoro based composite board, at least comprises following steps:
 at least a ceramic powder and/or glass fiber, a water soluble organic solvent, a fluoro based polymer suspension are mixed to form a mixture,
 disperse each ingredient of said mixture till said fluoro polymer and said ceramic powder coagulate,
 remove extra organic solvent and water from said mixture,
 said mixture is formed to a particular shape, and
 sinter said mixture to obtained said composite board,
 wherein the step of said ceramic powder and/or glass fiber, said water soluble organic solvent, said fluoro based polymer suspension are mixed to form a mixture, further comprises a step of adding suitable amount of water,
 wherein the process of said ceramic powder and/or glass fiber, said water soluble organic solvent, said fluoro based polymer suspension are mixed to form a mixture, said suitable amount of water are mixed to form a mixture, the ratio of each ingredient is adjusted to have said water soluble organic solvent to about 5–10 wt % of total mixture, and water is about 10–30 wt. % of total mixture.

2. A manufacturing method of fluoro based composite board of claim 1, wherein said polymer suspension is added after mixing said ceramic powder and/or glass fiber, said organic solvent, and said suitable amount of water.

3. A manufacturing method of fluoro based composite board of claim 2, wherein the manufacturing method further comprises a step of coating a layer of coupling agent on the surface of said ceramic powder and/or glass fiber.

4. A manufacturing method of fluoro based composite board of claim 3, wherein said coupling agent is selected from the group consisting of silane coupling agent, zirconium based coupling agent, titanium based coupling agent, fluoro based coupling agent.

5. A manufacturing method of fluoro based composite board of claim 3, wherein the step of coating a layer of coupling agent on the surface of said ceramic powder and/or glass fiber is mixing a coupling agent containing solution, said ceramic powder and/or glass fiber, and said suitable amount of water together to have said coupling agent coated on the surface of said ceramic powder and/or glass fiber.

6. A manufacturing method of fluoro based composite board of claim 3, wherein the step of coating a layer of coupling agent on the surface of said ceramic powder is mixing a coupling agent containing organic solution, said ceramic powder and/or glass fiber, and said organic solvent together to have said coupling agent coated on the surface of said ceramic powder and/or glass fiber.

7. A manufacturing method of fluoro based composite board of claim 1, wherein a layer of coupling agent is coated in advance on said ceramic powder and/or glass fiber.

8. A manufacturing method of fluoro based composite board of claim 7, wherein said coupling agent is selected from the group consisting of silane coupling agent, zirconium based coupling agent, titanium based coupling agent, fluoro based coupling agent.

9. A manufacturing method of fluoro based composite board of claim 1, wherein said organic solvent is selected from the group consisting of water soluble alcohol and water soluble ketone.

10. A manufacturing method of fluoro based composite board of claim 9, wherein said water soluble organic solvent is IPA.

11. A manufacturing method of fluoro based composite board of claim 1, wherein said fluoro based polymer is PTFE.

12. A manufacturing method of fluoro based composite board of claim 1, wherein a flow aid is added to said mixture.

13. A manufacturing method of fluoro based composite board of claim 1, wherein said flow aid is oil.

14. A manufacturing method of fluoro based composite board of claim 1, wherein a conducting layer is bonded on the surface of said composite board for being used as electrical substrate.

* * * * *